(12) United States Patent
Goroju et al.

(10) Patent No.: US 12,334,946 B2
(45) Date of Patent: Jun. 17, 2025

(54) ASYNCHRONOUS ANALOG-TO-DIGITAL CONVERTER

(71) Applicant: Texas Instruments Incorporated, Dallas, TX (US)

(72) Inventors: Rajashekar Goroju, Bangalore (IN); Prasanth K, Bangalore (IN); Dileepkumar Ramesh Bhat, Bangalore (IN); Rahul Sharma, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 169 days.

(21) Appl. No.: 18/090,997

(22) Filed: Dec. 29, 2022

(65) Prior Publication Data

US 2024/0106450 A1    Mar. 28, 2024

(30) Foreign Application Priority Data

Sep. 26, 2022 (IN) .............................. 202241054953

(51) Int. Cl.
*H03M 1/12* (2006.01)

(52) U.S. Cl.
CPC .................................. *H03M 1/1245* (2013.01)

(58) Field of Classification Search
CPC ...... H03M 1/1245; H03M 1/125; H03M 1/468
USPC .......................... 341/155, 144, 120, 118, 122
See application file for complete search history.

(56) References Cited

U.S. PATENT DOCUMENTS

| | | | |
|---|---|---|---|
| 2008/0136381 A1* | 6/2008 | Yang ...................... | G11C 5/147 365/189.09 |
| 2008/0278868 A1* | 11/2008 | Morino ................... | G05F 1/573 361/18 |
| 2014/0210653 A1* | 7/2014 | Harpe ..................... | H03M 1/08 341/110 |

\* cited by examiner

*Primary Examiner* — Peguy Jean Pierre
(74) *Attorney, Agent, or Firm* — Mandy Barsilai Fernandez; Frank D. Cimino (57) ABSTRACT

An integrated circuit including a comparator having an enable signal input and an output and timing circuitry. The timing circuitry includes a first transistor having a control terminal, a second transistor having a control terminal, a first inverter having an input coupled to the control terminal of the second transistor and having an output coupled to the enable signal input, and a second inverter having an input coupled to the output of the comparator and having an output coupled to the control terminal of the first transistor.

20 Claims, 9 Drawing Sheets

ASYNCHRONOUS ANALOG-TO-DIGITAL CONVERTER

CROSS-REFERENCE TO RELATED APPLICATION

This application claims the benefit of and priority to India Provisional Application No. 202241054953, filed Sep. 26, 2022, which is incorporated herein by reference.

BACKGROUND

The described examples relate to integrated circuits (singular IC, plural ICs) and more particularly to circuits that include an asynchronous analog-to-digital converter (ADC), for example in a successive approximation register (SAR) loop. A SAR loop may be implemented in numerous devices, for example in an ADC. The SAR loop implements a binary search process, for example where an input voltage is successively compared to different reference voltages. After an initial comparison to a first reference voltage, which may be half of the voltage swing of the available comparison reference voltages, each subsequent and different reference voltage is selected based on whether a preceding comparison provided an above-reference or below-reference result. The speed of such operations may be limited, based on one or more of comparison delay, SAR logic delay, or variation in other delay-generating elements, among other considerations.

SUMMARY

In one example, there is an integrated circuit. The integrated circuit includes a comparator having an enable signal input and an output and timing circuitry. The timing circuitry includes a first transistor having a control terminal, a second transistor having a control terminal, a first inverter having an input coupled to the control terminal of the second transistor and having an output coupled to the enable signal input, and a second inverter having an input coupled to the output of the comparator and having an output coupled to the control terminal of the first transistor.

Other aspects are also described and claimed.

BRIEF DESCRIPTION OF THE DRAWINGS

The same reference numbers or other reference designators are used in some instances in the drawings to designate the same or comparable (structurally and/or functionally) features.

DETAILED DESCRIPTION

In a SAR architecture, such as in an ADC, an input voltage is sampled (sampled and held) and iteratively compared to successively different threshold voltages. Often, all of the threshold voltages, other than the first, are generated based on a prior comparison in the iterations, ultimately for quantizing the analog voltage to a digital value (resolution) of N bits. Functional timing is controlled based on considerations which often include accuracy and efficiency. In one approach, an external clock may be used to time the various functions, but such an approach may require the clock period to span a worst-case duration. This approach, however, imposes a duration that can impose unnecessarily longer delays on certain functions, where the duration could be reduced. Alternative approaches, as used below, include asynchronous operation, that is, with internal and variable duration control of the SAR sequencing, so as to reduce one or both of operational delay and power consumption.

Figure 1:
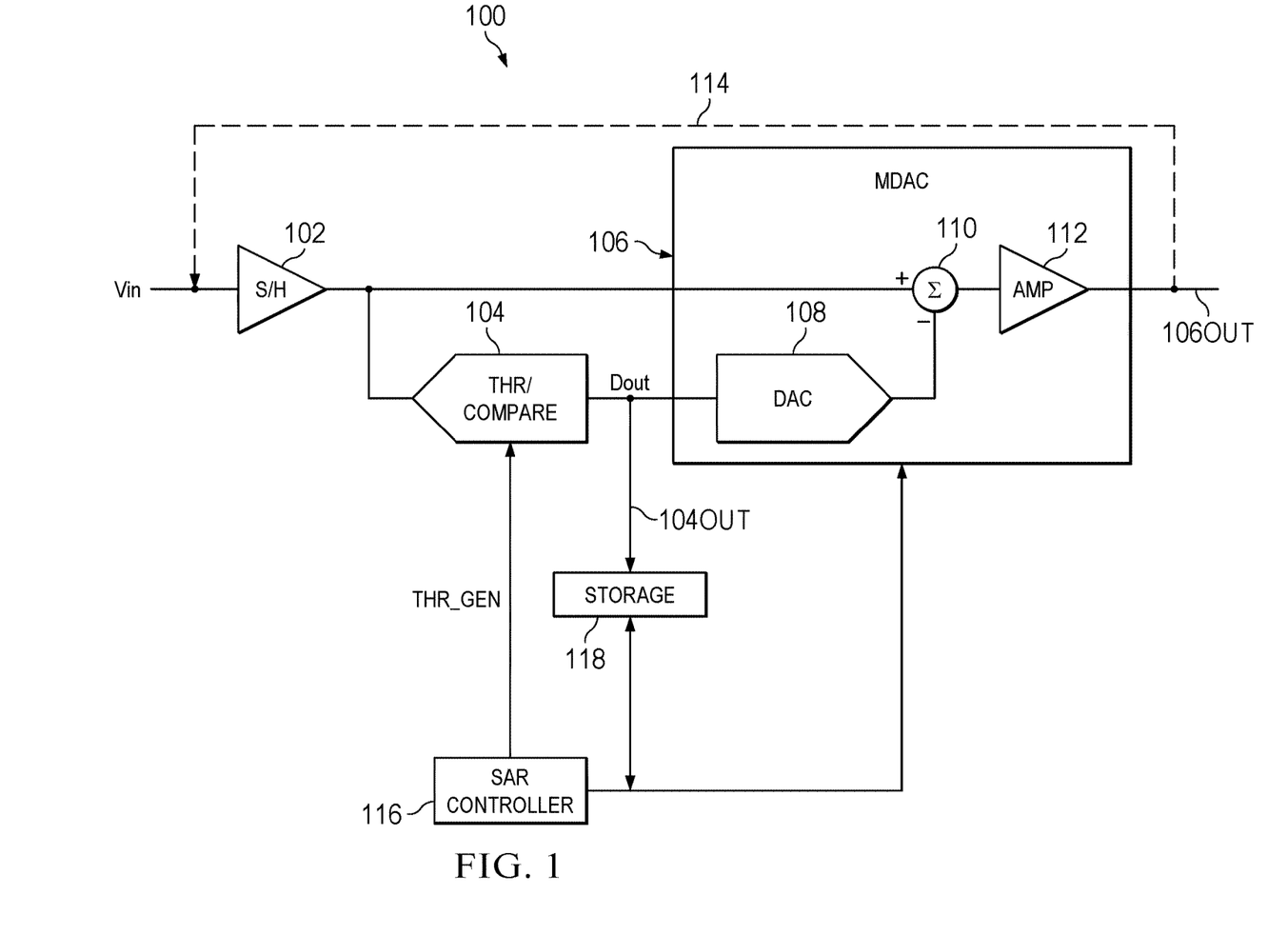
FIG. 1 is an electrical diagram of an example ADC 100.

FIG. 1 is an electrical diagram of an example ADC 100. As shown, the ADC 100 includes sample and hold (S/H) circuit 102, a threshold, compare, and ADC (THR/COMPARE) circuit 104, a multiplicative digital-to-analog converter (MDAC) 106, a SAR controller 116, and a storage circuit 118. These described circuits are also referred to as blocks. As shown, an output of the S/H block 102 is coupled to a first input of the THR/COMPARE block 104 and to a first input of the MDAC 106. An output of the THR/COMPARE block 104 is coupled to a second input of the MDAC 106 and to an input of the storage block 118. A first output of the SAR controller 116 is coupled to a second input of the THR/COMPARE block 104 to provide a first control signal. A second output of the SAR controller 116 is coupled to a third input of the MDAC 106 to provide a second control signal. An output of the MDAC 106 may couple to another stage, or optionally couple to an input of the S/H block 102.

The ADC 100 is formed, for example, as an integrated circuit (IC), with the IC including only the ADC 100 or additional components and functions. Also, the ADC may be incorporated into larger functional devices, including processors of different types. The ADC 100 can receive an analog input voltage Vin and quantize the input voltage to an N-bit digital representation output, Dout, sometimes indicated as the ADC having N-bit resolution. In the illustrated example, the ADC 100 represents a stage that can be replicated, or used in successive iterations. Accordingly, for a single instance (either stage or iteration), Dout is less than N bits. However, the bits from each instance are stored or otherwise aggregated to provide the final N-bit resolved output.

The various blocks (circuits) of the ADC 100 are connected and function to achieve the above-introduced quantization of Vin to Dout. Vin is provided as an input signal to an input of the S/H block 102. The S/H block 102 samples Vin, for example at a sampling frequency at least twice as high as the frequency of Vin. The S/H block 102 outputs its sampled value for a sufficient duration (the "hold" aspect), so that the remainder of the FIG. 1 blocks may operate appropriately. The output of the S/H block 102 is connected to an input of the THR/COMPARE block 104 and also to an input of the MDAC 106.

The THR/COMPARE block 104 includes circuitry for each of its stated functions. For example, the THR/COMPARE block 104 includes a switched capacitor DAC (C-DAC, see FIG. 2) that generates a comparison threshold voltage Vcthr. The THR/COMPARE block 104 also includes a latch (see FIG. 8) that compares two values. Collectively, the C-DAC and latch operate as an ADC, within the larger ADC 100, to provide a digital output indicating the comparison result on the output 104OUT. The THR/COMPARE block 104 provides the comparison result as one or more bits of Dout to the output 104OUT. Accordingly, the THR/COMPARE block 104 operates iteratively to generate more than one bit of Dout at the output 104OUT, which is coupled to the MDAC 106 and to the storage block 118.

The MDAC 106 includes a DAC 108, a summation circuit (block) 110, and an amplifier 112. The input of the DAC 108 is connected to the output of the THR/COMPARE block 104. A positive input of the summation block 110 is connected to the output of the S/H block 102, and a negative (subtraction) input of the summation block 110 is connected to the output of the DAC 108. The output of the summation block 110 is connected to an input of the amplifier 112. The signal from the output of the summation block 110 is referred to as a residual. The output of the amplifier 112 is the output 106OUT of the MDAC 106.

Further, the output 106OUT may be connected to a next instance of the ADC 100. The next instance may be either a replicated stage or a successive operation of the same stage, either of which is sometimes referred to as pipelining of ADC stages. For example, the FIG. 1 circuitry may be replicated and the output 106OUT connected to such a replication, or more than one replication in series. Each of the first and replicated stages thereby determines one or more bits of Dout that are then accumulated (e.g., concatenated) to form the final N-bit Dout value. Further, a final stage may be provided as a flash ADC, which is operable to resolve an analog voltage to a digital bit or bits value in a single operation, for example by comparison to a resistor/comparator ladder.

As an alternative example, a next instance may be implemented, as shown by a dashed feedback line 114, by connecting the output 106OUT back to the input of the S/H block 102. Accordingly, the FIG. 1 circuitry is operated under control of the SAR controller 116 over successive sequences, in which Dout for each sequence is preserved in the storage block 118. In one example, the storage block 118 is a data latch, as detailed later. The SAR controller 116 may be constructed of various hardware (and may include some programming aspect), with particular details in connection with its sequencing control, by asynchronous timing, detailed later. In all events, various teachings herein may apply to the ADC 100 as a whole, including the ADC functionality of the THR/COMPARE block 104. The various teachings herein may also apply to other ADCs, such as a flash ADC included at the end of a series of replicated blocks as those in FIG. 1, and various related control and timing circuitry.

An example is now described in which the FIG. 1 circuitry operates in N successive one-bit iterations. Each iteration provides a one-bit Dout. The single-bit Dout values are accumulated over N cycles to provide an N-bit quantized value of Dout. Generally, the SAR controller 116 controls the sequencing as described. Further, the sequencing achieves a binary search process, in which a search range is divided into halves. The input is compared to determine if it falls within the upper or lower half of that range. This process repeats so that each prior range in which an input is found is further divided into half. The determination of whether the input falls within the upper or lower half of that now further-divided range is also repeated, until all searches are complete. The successive halving of ranges in this manner is accomplished in part by differing controls to the C-DAC of the THR/COMPARE block 104. For example, the C-DAC includes a bank of different sized capacitors, which are successively larger in capacitance by orders of two, and internal switching to generate a common voltage, which is modified by Vin and compared to a reference voltage. Various other details of such a C-DAC are described by reference to FIG. 2.

An example operation of the ADC 100 follows. Assume that N=4, that the ADC 100 can quantize from 0 to $2^{(N=4)}=16$ volts, and that 0≤Vin≤16 volts. Further, assume that Vin=6.6 volts. Accordingly, after N=4 cycles, the ADC 100 quantizes the Vin=6.6 volts to a 4-bit value Dout, which indicates (or approximates) the Vin value of 6.6 volts.

In this example, a first of the N=4 sequences of the ADC 100 operation corresponds to determining the most significant bit (MSB) of Dout. Accordingly, the Vin=6.6 volts is sampled by the S/H block 102, and the sampled value is held at its output. The THR/COMPARE block 104 receives a threshold voltage generation trigger, THR_GEN from the SAR controller 116 (or internally generates it). In response to THR_GEN, its DAC (e.g., C-DAC) generates the comparison threshold voltage, Vcthr, against which the sampled value of Vin is compared. Note that the use of Vcthr is a simplification of what might be the actual operation in the C-DAC, which ultimately provides two voltages for comparison that equivalently compare Vin to what is referred to Vcthr. Accordingly, the C-DAC may determine those two compared voltages by modifying one in response to Vin, and providing the other voltage as a common mode voltage (e.g., ground). Also, Vcthr is based on the current stage sequence, whereby for the first sequence Vcthr is one half of the voltage range of the ADC 100.

In the example where ADC 100 can resolve up to 16 volts by virtue of its N=4 bits resolution, in a first iteration, Vcthr=½ (16 volts)=8 volts. This corresponds to the total 16 volt range being split into 8 volt halves. Accordingly, in a first stage sequence, Vin=6.6 volts is compared to Vcthr=8 volts. As such, a digital output of a first state, for example a logic zero when Vin<Vcthr, is output as Dout. This digital output is stored in the storage block 118, as the MSB of Dout. The MSB equal to zero, or multiple most significant bits if the stage is capable of determining multiple bits, is also provided to the DAC 108.

For example, assume that the FIG. 1 illustration is a 2-bit stage of the total N=4 bit resolution of the ADC 100. In that example, after the stage resolves the MSB of zero in a first sequence, the SAR controller 116 issues control signaling that causes another sequence iteration. This next sequence iteration is directed to the next lesser significant bit, based on the first determined bit of value zero. Specifically, THR_GEN is provided to the C-DAC of the THR/COMPARE block 104, where the C-DAC is switched based in part on the current bit being determined. For example, where the first sequence compared Vin to ½ of the total resolution (e.g., ½*16 volts=8 volts), the next sequence compares Vin to ½ of the prior evaluated resolution (e.g., ½*8 volts=4 volts).

Additionally, the C-DAC switching is based on any prior more significant bits determined for the stage, so that the compared voltage, of ½ of the prior compared voltage, is within a proper range either above or below the prior comparison. For example, the first sequence compared Vin=6.6 volts to a Vcthr=8 volts. Therefore, because the resultant MSB indicates that Vin is less than Vcthr, the next determined Vcthr in the binary search should be the lower half as compared to the prior one. Accordingly, the comparison of the second sequence is to 4 volts. Whereas, if Vin had been higher than Vcthr in the prior sequence, the comparison would be to the upper half, e.g., to 12 volts. Thus, the C-DAC is switched to compare Vin=6.6 volts to Vcthr=4 volts, yielding the next bit of Dout as a one, as Vin>Vcthr.

In the current example, the first stage determines a 2-bit binary output of 01, with the remaining 2-bits to be determined by a separate stage or stages. At this point, a partial total digital output Dout has been determined of 01xx, with the value of each "x" still to be determined. The 2-bit binary output is provided to the DAC 108, which outputs an analog voltage corresponding to the portion of the value determined by the first two sequences. Since the partial output is 01xx, the DAC 108 outputs an analog signal of 6.0 volts. The 6.0 volts is provided to the negative input of the summation block 110. The summation block 110 subtracts the 6.0 voltage from the current hold output value of the S/H block 102, which is currently 6.6 volts. The amplifier 112 amplifies the difference, or residual, of 0.6 volts, and provides the amplified signal via the output 106OUT back to the S/H block 102. The amplified signal becomes a next successive value of Vin, which can be further resolved to determine the remaining 2 bits of the total N=4 bit determination. For example, the remaining 2 bits are determined in a similar manner as described above with respect to the first 2 bits. In this manner, when a second stage is resolving those additional bits, the first stage may undertake a new conversion, thereby improving throughput for successively converted voltages.

Figure 2:
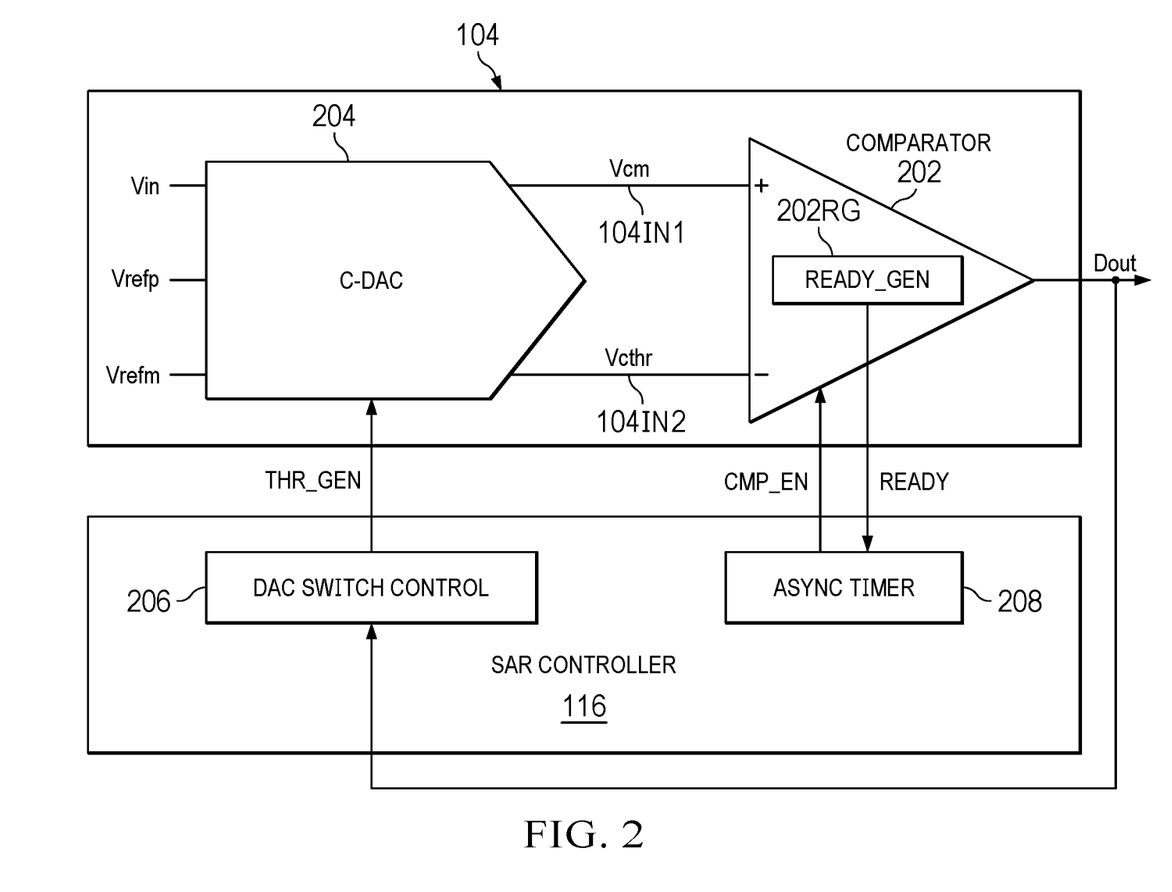
FIG. 2 is an electrical diagram of selected additional details for the FIG. 1 THR/COMPARE block 104 and the SAR controller 116.

FIG. 2 is an electrical diagram of selected additional details for the FIG. 1 THR/COMPARE block 104 and the SAR controller 116. The THR/COMPARE block 104 includes a comparator 202 and a C-DAC 204, which collectively receive and provide the signaling for the above-described comparison of Vin to Vcthr. As shown, first and second outputs of the C-DAC 204 are coupled to first and second inputs, respectively 104IN1 and 104IN2, of the comparator 202. In the illustrated example, the C-DAC 204 receives Vin and respective positive and negative reference voltages Vrefp and Vrefin, at respective first, second, and third, inputs. The difference between Vrefp and Vrefin defines the total range of the ADC 100 or a stage thereof.

The C-DAC 204 provides two voltages for comparison by the comparator 202, namely, a common mode voltage Vcm and Vcthr. The C-DAC 204 provides Vcm to input 104IN1 and provides Vcthr to input 104IN2, of the comparator 202. For example, the first input 104IN1 is a positive input, and the second input 104IN2 is a negative input. The labels of Vcm and Vcthr are used generally in the example, as different combinations of C-DACs and comparing functionality may provide different voltages to be compared, depending for example on the switching and configuration of the C-DAC. Accordingly, Vcm and Vcthr represents two different voltages, resulting from operation of the C-DAC 204. When Vcm and Vcth are compared to one another, the result indicates whether for a given comparison iteration, Vin is greater or less than a comparison voltage generated for that iteration. Moreover, the comparison voltage depends on the bit significance of the N-bits of Dout being determined.

The C-DAC 204 is controlled by the SAR controller 116, which for this purpose is shown to include a DAC switch control 206 and an asynchronous ("ASYNC") timer 208. The C-DAC 204 may also be controlled by one or more of the digital output bit(s) Dout from the comparator 202, through the DAC switch control 206, for example to iteratively adjust Vcthr based on successive sequences, as introduced above. Additionally, the comparator 202 operates in response to a signal CMP_EN. When asserted (e.g., high), CMP_EN enables the comparator 202 to perform a comparison of the values at its first and second inputs 104IN1 and 104IN2. When de-asserted (e.g., low), CMP_EN resets the comparator 202, for example prior to a next comparison operation. In FIG. 2, CMP_EN is provided to the comparator 202 by the SAR controller 116. More particularly, the SAR controller 116 includes a sequencing circuit, shown as the asynchronous timer 208. The term asynchronous is used in this context to connote that timing is based on operational events, as opposed to some fixed synchronizer, as would be accomplished with a fixed frequency clock (either internal or external).

The comparator 202 also includes a READY signal generator (shown as READY_GEN) 202RG, which includes circuitry, as detailed later in FIG. 8, that provides a READY signal to the SAR controller 116 and, more particularly, to the asynchronous timer 208. Particularly, when the comparator 202 has completed a comparison, the READY signal generator 202RG asserts READY (e.g., high). Conversely, when the comparator 202 reaches a certain level of shutdown, for example after CMP_EN falls, the READY signal generator 202RG de-asserts READY (e.g., low). Accordingly, READY indicates comparator 202 status to the SAR controller 116 and, as detailed below, may be used as part of the asynchronous timer 208 sequence triggering.

Figure 3:
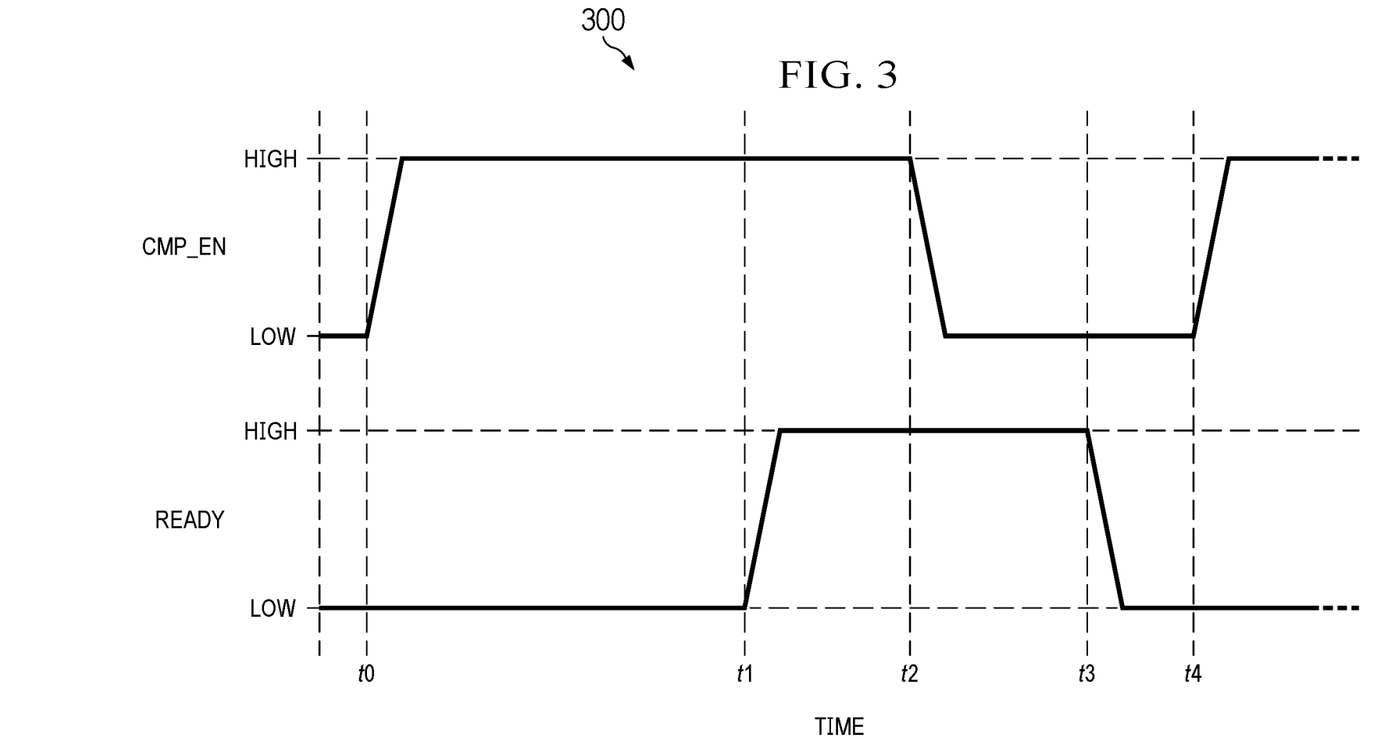
FIG. 3 is a timing diagram 300 of the CMP_EN and READY signals of FIG. 2.

FIG. 3 is a timing diagram 300 of the FIG. 2 CMP_EN and READY signals, further in view of the earlier-described FIG. 1 ADC 100 operation. Generally, the timing diagram 300 illustrates the CMP_EN and READY signaling for a single operational sequence, including the readying of the comparator 202, its comparison, and its resetting. While not shown, also occurring concurrently with that sequence is the Vcthr generation, that is, the threshold against which Vin is compared, as achieved by the separate C-DAC 204.

At time t0, the asynchronous timer 208 asserts CMP_EN to the comparator 202. At t0, the comparator 202 is enabled for comparison and it starts taking decision corresponding to its input. At t1, the output of the comparator 202 is available and READY is set high. Accordingly, following t1, and before t2, the comparator 202 compares Vin to Vcthr and outputs Dout. Once Dout has been output (and may be saved, for example in the storage block 118), the comparator 202 may be reset. Accordingly at t2, which is at some point following the comparator-asserted READY, the asynchronous timer 208 de-asserts CMP_EN to the comparator 202. The de-asserted CMP_EN resets the comparator 202, in which the comparator 202 shuts down until a next assertion of CMP_EN. This step is also implemented to erase the memory of the previous decision from the comparator 202. As the comparator 202 shuts down in this manner, at t3 the comparator 202 de-asserts READY. Following t3, a next value of Vcthr is established (e.g., by the C-DAC 204), and the above signal transitions may repeat for a next iteration sequence. Namely, the time t4 corresponds to a repeat of the transitions for a next sequence starting at t0.

Figure 4:
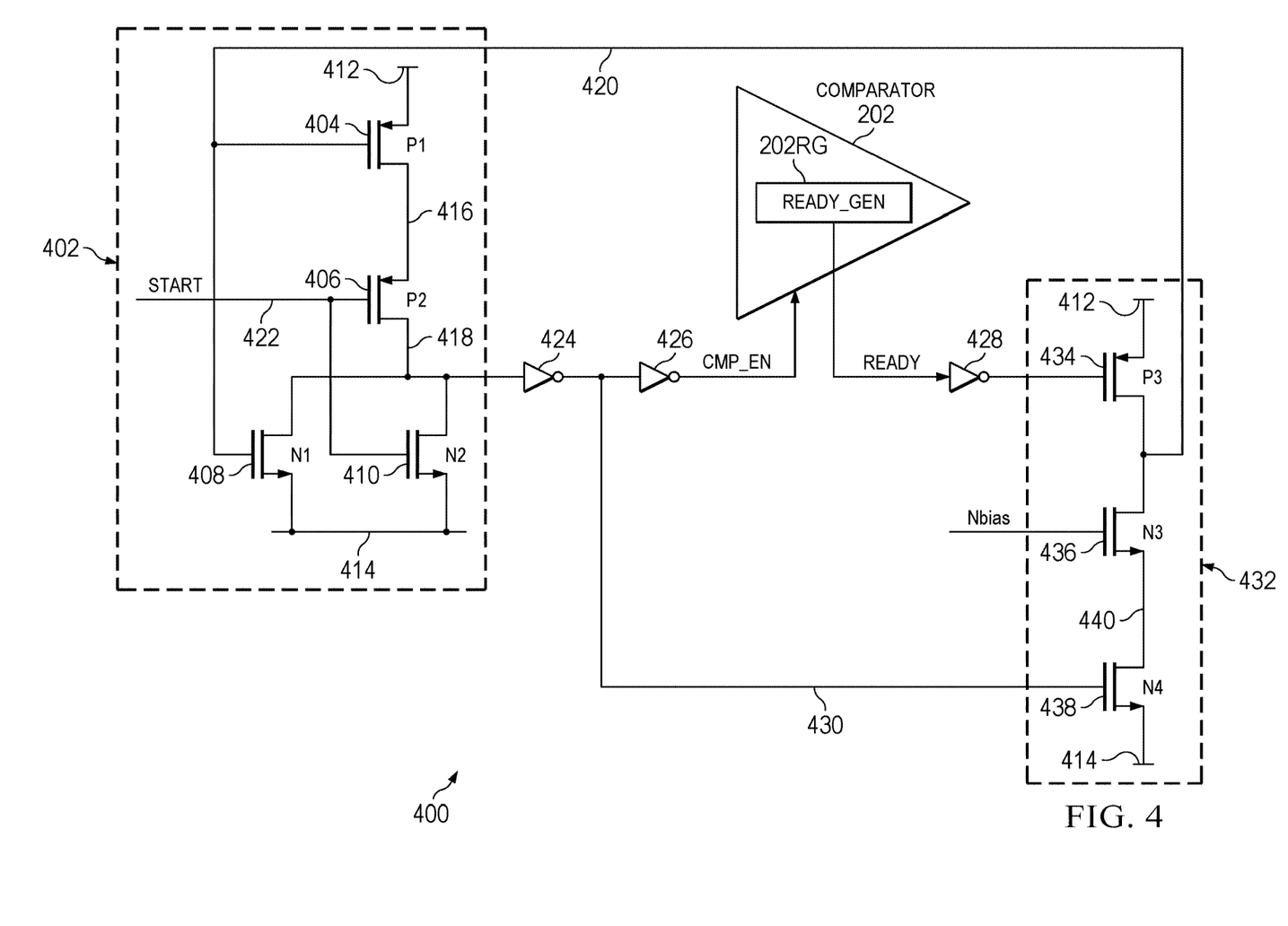
FIG. 4 is an electrical diagram of a first example of a timing circuitry 400 as may be implemented in the FIG. 2 asynchronous timer 208.

FIG. 4 is an electrical diagram of a first example of a timing circuitry 400 as may be implemented in the FIG. 2 asynchronous timer 208, so as to achieve the FIG. 3 timing diagram 300. By way of introduction, an architecture may control asynchronous timing with a chain of series-connected inverters. However, signal propagation through each such inverter imposes a corresponding delay. Therefore, the total delay generally includes or is based on the total number of inverters times the delay per inverter operation. Accordingly, such an approach may provide a total delay that may be undesirable for certain implementations, for example by undesirably or unnecessarily delaying the operation of one or more components, thereby increasing the total operational time of the ADC 100. The first example 400, as well as others described below, improve upon such considerations, for example by decreasing the overall delay (and corresponding power consumption if such delay is incurred), among other benefits.

The timing circuitry 400 includes a number of inverters 424, 426, and 428 and transistors or transistor stages (in this example transistor stages 402 and 432). Herein, a transistor stage includes related transistors having a series or parallel connection, or both, between respective source/drain paths. Further, since the timing circuitry 400 relates to the ADC 100 signal timing, FIG. 4 also shows certain connections to the comparator 202, including its READY signal generator 202RG. Generally, a signal to the left of FIG. 4 propagates to the right, and incurs a delay, through each of the various transistor stages and inverters, and the comparator 202. For reference, each stage or inverter is assumed to provide an approximate one-inverter delay, and the comparator 202 provides an approximately 400 psec delay. These delays contribute in part to the timing of different transitions in the circuit, and also as explained below permit certain transitions to occur at different times based on the signal position in the circuit.

A first transistor stage 402 includes a first p-channel metal oxide semiconductor (PMOS) transistor P1 404, a second PMOS transistor P2 406, a first n-channel metal oxide semiconductor (NMOS) transistor N1 408, and a second NMOS transistor N2 410, generally connected as shown between a high voltage reference terminal 412 and a low voltage (e.g., ground) reference terminal 414. For example, the terminal 412 is coupled to a voltage supply (not shown) that provides the voltage at terminal 412, and the terminal 414 is coupled to a ground plane (not shown). The P1 404 source is connected to the high voltage reference terminal 412, and the P1 404 drain is connected a first node 416. Herein, a node refers to a common electrical point of contact in a circuit, such as one or more common or shared electrical traces or conductors between two or more electrical elements. The P2 406 source is connected to the first node 416, and the P2 406 drain is connected a second node 418. Each of the N1 408 drain, and the N2 410 drain, is connected to the second node 418, and each of the N1 408 source, and the N1 410 source, is connected to the low voltage reference terminal 414. Each of the P1 404 gate, and the N1 408 gate, is connected to a third node 420. Each of the P2 406 gate, and the N2 410 gate, is connected to a fourth node 422. The node 422 receives a START signal.

The second node 418 is also connected to an inverter chain that generally includes the first inverter 424, the second inverter 426, and the third inverter 428. Specifically, the second node 418 is connected to the first inverter 424 input. The first inverter 424 output is connected to a fifth node 430 and to the second inverter 426 input. The second inverter 426 output is connected, and provides the CMP_EN signal, to a compare enable input of the comparator 202. A ready signal output of the comparator 202 (which provides the READY signal) is connected to the third inverter 428 input, and the third inverter 428 output is connected to a second transistor stage 432.

The second transistor stage 432 includes a third PMOS transistor P3 434, a third NMOS transistor N3 436, and a fourth NMOS transistor N4 438. The P3 434 gate is connected to the third inverter 428 output to receive the READY signal from the comparator 202, after being inverted by the third inverter 428. The P3 434 source is connected to the high voltage reference terminal 412, and the P3 434 drain is connected to the third node 420 to provide feedback to the first transistor stage 402. The N3 436 gate receives an Nbias signal. For example, the Nbias signal is a fixed internally generated (and sustained) signal. The N3 436 drain is connected to the third node 420, and the N3 436 source is connected to a sixth node 440. The N4 438 gate is connected to the fifth node 430. The N4 438 drain is connected to the sixth node 440, and the N4 438 source is connected to the low voltage reference terminal 414.

The timing circuitry 400 operation may be understood with references to FIG. 2 through FIG. 4. When operation is desired, and for example from signaling within or external to the SAR controller 116 (FIG. 2), START (FIG. 4) is asserted low, which enables the P2 406. Also, the Nbias signal is biased at an appropriate voltage, so that the N3 436 acts like a current source during the times when the N4 438 is turned on. In the startup condition, the feedback signal from the third node 420 is also low, thereby enabling the P1 404. Accordingly, a high signal, from the high voltage reference terminal 412, is coupled through the enabled P1 404 and P2 406 to the second node 418. With a one-inverter delay, the high signal is inverted to a low signal by the first inverter 424. The inverter 424 provides the low signal to the fifth node 430, thereby providing a non-enabling signal to the N4 438 gate. The inverter 424 also provides the low signal to the input of the second inverter 426.

Also, with a one-inverter delay, the second inverter 426 inverts the low signal to a high signal, provided as CMP_EN asserted to the comparator 202 at time t0. As earlier described, the comparator 202 is enabled by the CMP_EN rising transition. After some settling time between t0 and t1, the comparator 202 outputs an asserted high READY. With a one-inverter delay, the high READY is inverted by the third inverter 428. The inverter 428 provides a low and enabling signal to the P3 434 gate, which after another one-inverter delay, and during the startup, enables the P3 434. Enabling or turning on the P3 434 provides a high signal from the high voltage reference terminal 412 to the third node 420, which feeds back to the first transistor stage 402.

After the startup, the START signal remains de-asserted, for all operations when a comparison is to be performed. Further, the high signal fed back from the third node 420 is provided to the first transistor stage 402, namely to the P1 404 gate and the N1 408 gate. The high signal disables (turns off) P1 404 and enables (turns on) N1 408, so that after a one-inverter delay a low signal is provided to the second node 418.

Over a next one-inverter delay, the second node 418 low signal is inverted by the first inverter 424 to a high signal at the fifth node 430, which is provided to the input of the second inverter 426 and to the N4 438 gate. Accordingly, each of those two receiving devices responds in approximately the same amount of time, another one-inverter delay. By completion of that one-inverter delay, the second inverter 426 inverts the high at the fifth node 430 to a CMP_EN signal transitioning to a low that disables the comparator 202. Also, by completion of that one-inverter delay, the high at the fifth node 430 is enabling to the N4 438 gate. In response, the N4 438 conducts a low signal (from the low voltage reference terminal 414) to the third node 420. The time taken to pull the third node 420 down depends on the current that is used to generate Nbias. This is the delay that defines a DAC voltage/Vcthr settling time, which is desirably tightly controlled, in an example. Accordingly, the low signal provides a new state at the third node 420 (from its prior high state) while, at the same time, the comparator 202 shuts down. Meanwhile, around this same time, the state of READY to the third inverter 428 input, and the output signal of the inverter 428 output, as provided to the P3 434 gate, does not immediately change. However, READY is controlled to go low before CMP_EN is again asserted high.

Given the preceding, note that the first inverter 424 output, connected directly as a control to the second transistor stage 432, allows the potential passage of a high signal to impact the state of the second transistor stage 432 (by enabling the N4 438). This is achieved without first incurring the additional delay of the signal path through the second inverter 426, the comparator 202, and the third inverter 428. In this way, a condition may be set in motion to facilitate a next rising transition of CMP_EN, irrespective of the non-operational timing of the comparator 202 itself. In other words, in the above example, when CMP_EN transitioned low, as shown at and following t2 in FIG. 3, a sequence continues with the beginning of the comparator 202 shutdown followed later, indicated at t3, by the falling READY transition. However, at around the same time of t2, the first transistor stage 402 receives the low signal from the third node 420, which as now described facilitates the next rising edge of CMP_EN.

The time required to pull the third node 420 low depends on the bias current that is generated by Nbias. Particularly, this time is approximately equal to a time I/C, where C is the total capacitance at the third node 420, and I is the current through the N3 436 and the N4 438 transistors, when the N4 transistor 438 is ON. This current based delay generation method is used because the I/C factor variation across process, voltage, temperature (PVT) corners is in general smaller than the equivalent inverter delay variation. Hence, the overall variation in total conversion time tends toward optimal.

The low from the third node 420 is enabling to the P1 404 gate. Accordingly, the P1 404 turns on over approximately a one-inverter delay, while the P2 406 is already enabled from the asserted (low) START. With both the P1 404 and the P2 406 enabled, a high signal is provided from the high voltage reference terminal 412, through P1 404 and P2 406, to the second node 418. Meanwhile, during this one-inverter delay, the comparator 202 continues to be shut down, from the ongoing and not-yet changed low of CMP_EN from the second inverter 426 output. Next, over another one-inverter delay, the high at the second node 418 is inverted, by the first inverter 424, to a low to the fifth node 430. This low is provided both to the second inverter 426 input and as a non-enabling signal to the N4 438 gate. Next, over another one-inverter delay and as shown at t0, the low at the second inverter 426 input is inverted to a high CMP_EN. As detailed above, this high CMP_EN enables the comparator 202, after which the above sequences can repeat over time, thereby repeating the FIG. 3 signaling.

The preceding demonstrates that each sequence of the ADC includes the steps of: (i) enabling the comparator 202, by asserting CMP_EN; (ii) the comparator 202 responding to the enablement by comparing its inputs to provide an output and then asserting READY; (iii) resetting the comparator 202 by de-asserting CMP_EN; and (iv) the comparator 202 responding to the reset by shutting down in some form and de-asserting READY. With the timing circuitry 400, a subsequent assertion of CMP_EN is ultimately triggered by the previous rising READY. Thus, CMP_EN is triggered independently of how long the comparator 202 takes to de-assert READY.

In other words, once READY transitions high, that transition causes, through intermediary connections, the next falling CMP_EN via the output of the second inverter 426. However, the same high input to the inverter 426 that causes that falling CMP_EN also enables the N4 438, which causes the next rising CMP_EN. Accordingly, the subsequent assertion of CMP_EN may be triggered relative to (as delayed by the second stage 432, the first transistor stage 402, and the first and second inverters 424 and 426) the immediately-preceding assertion of READY.

This connectivity and/or functionality may beneficially reduce ADC operational time. For example, for some comparison operations, for instance when Vin is relatively close to Vcthr, the comparator 200 may take longer to resolve a comparison due to the relatively closeness of the two compared values. Accordingly, if the immediately next comparison is timed to the completion of the current comparison, the delay in the relatively-close current comparison will delay the start of the next comparison. Or, if the system is clocked with an external clock, the clock duration may be established based on this worst-case delay scenario. In either event, this added delay can propagate and/or repeat for subsequent relatively close comparisons. In contrast, the example ADC 100 may perform successive comparisons with less delay, where the actual time delay reduction depends on the number and type of interim devices not involved in the signal trigger path. For example, in the FIG. 4 configuration, the delay reduction may be approximately 400 psec, where the fifth node 430 bypasses the second and third inverters 426 and 428, as well as the comparator 202. Further, such a bypass enables the design to achieve a least possible CMP_EN low time, which is also the time available for Vcthr settling.

Figure 5:
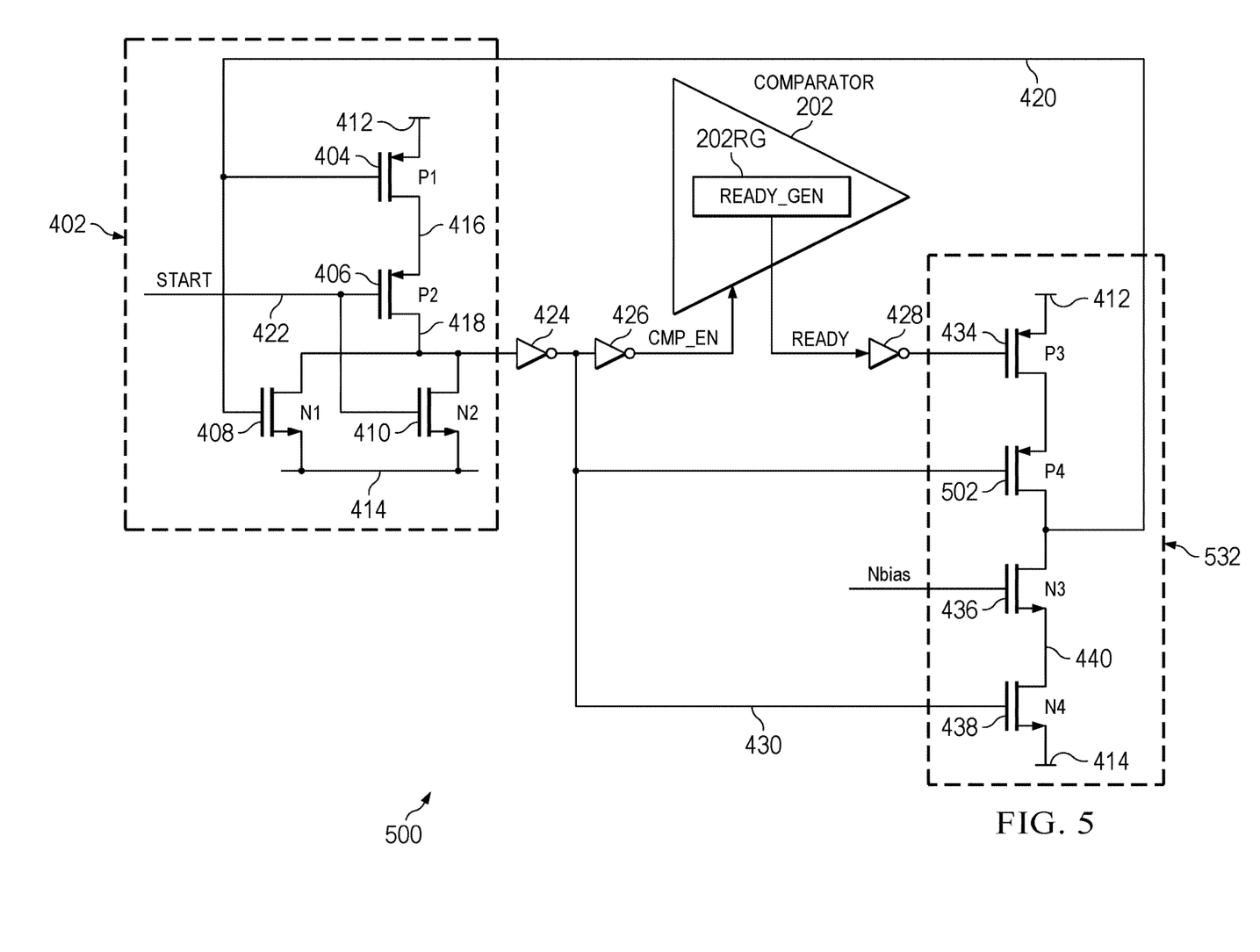
FIG. 5 is an electrical diagram of a second example of a timing circuitry 500 as may be implemented in the FIG. 2 asynchronous timer 208.

FIG. 5 is an electrical diagram of a second example of a timing circuitry 500 as may be implemented in the FIG. 2 asynchronous timer 208, so as to achieve the FIG. 3 timing diagram 300. The timing circuitry 500 includes the same elements as the FIG. 4 timing circuitry 400, with an additional component and connectivity added with respect to a second transistor stage 532. Specifically, instead of a direct connection between the drain of P3 434 drain and the N3 436 drain, an additional fourth PMOS transistor P4 502 is included. The P4 502 source is connected to the P3 434 drain. The P4 502 gate is connected to the fifth node 430, and the P4 502 drain is connected to the third node 420. Accordingly, the source/drain path of the P4 502 is connected between the drain of the P3 434 and the drain of the N4 438, through the N3 436.

The operation of the timing circuitry 500 includes the addition of the P4 502, which further reduces the possibility of a concurrent current path through the P3 434 and the N4 438, and through a load capacitance, not shown. Specifically, as described above, in the FIG. 4 timing circuitry 400, a signal at the fifth node 430 enables the N4 438 gate, and that fifth node 430 signal also propagates through a separate path. The separate path includes, and provides an additional delay, through the second inverter 426, the comparator 202, and the third inverter 428. Thus, the fifth node 430 signal must propagate through this separate path before it may have an impact on the P3 434. Accordingly, if the N4 438 is enabled prior to that delay completing (for example at any time between FIG. 3 t2 and t3), and if the P3 434 is enabled during that delay, there is the possibility of both the P3 434 and the N4 438 conducting at a same time (and current also being shared with a load capacitance, not shown). However, in FIG. 5, if the fifth node 430 transitions high, providing an enabling signal to the N4 438 gate, that high signal also provides a disabling signal to the P4 502 gate. Thus, as the N4 438 begins to turn on, the P4 502 is turned off, thereby reducing the chance of the above-described current path. In absence of the P4 502, the P3 434 and the N4 438 may be on at the same time, in which comparator low time or Vcthr settling time variation may be high across PVT corners, not very tightly controlled.

Figure 6:
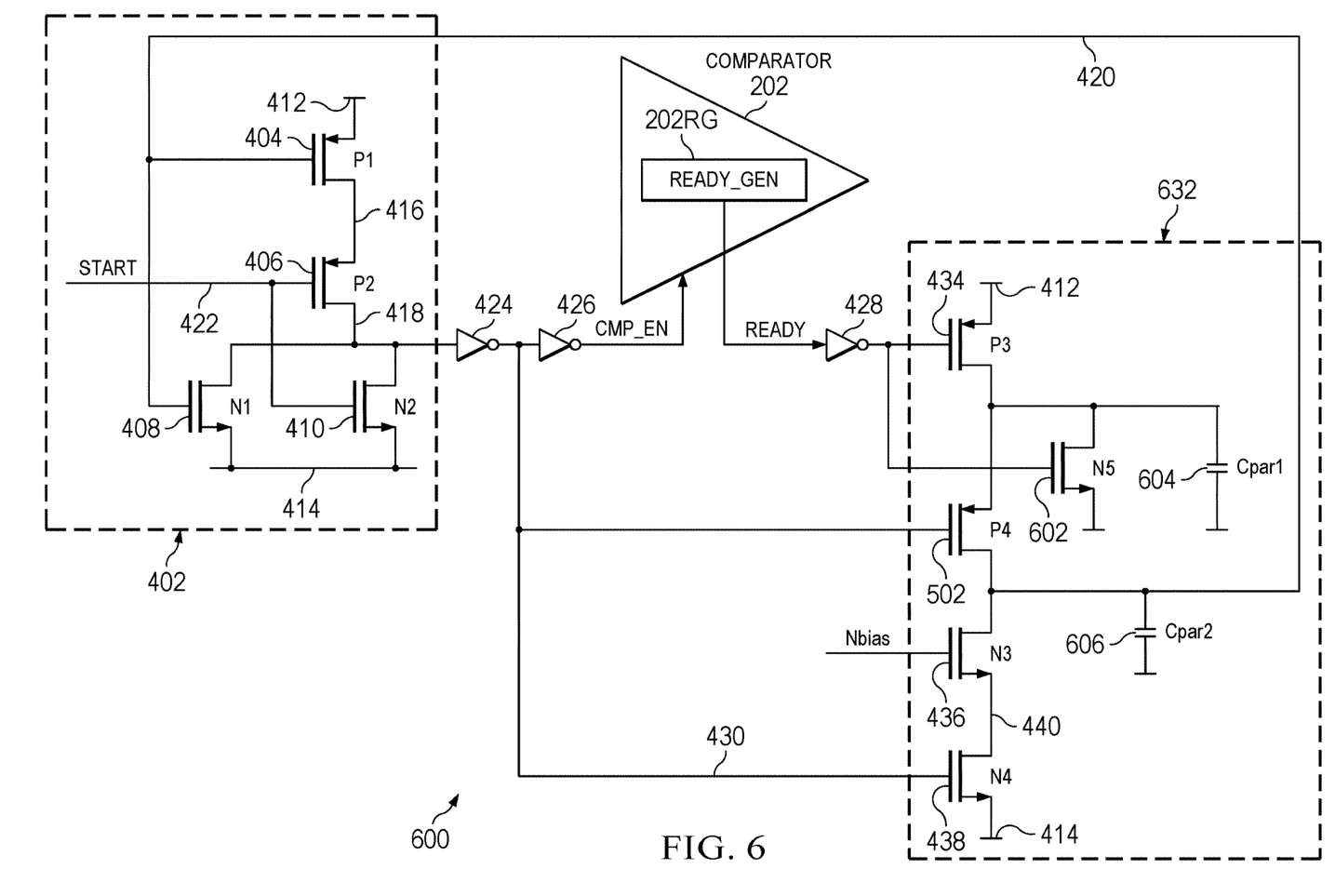
FIG. 6 is an electrical diagram of a third example of a timing circuitry 600 as may be implemented in the FIG. 2 asynchronous timer 208.

FIG. 6 is an electrical diagram of a third example of a timing circuitry 600 as may be implemented in the FIG. 2 asynchronous timer 208, so as to achieve the FIG. 3 timing diagram 300. The timing circuitry 600 includes the same elements as the FIG. 5 timing circuitry 500, with an additional component and connectivity added with respect to a second transistor stage 632. Specifically, the timing circuitry 600 includes a fifth NMOS transistor N5 602. The N5 602 drain is connected to the P3 434 drain and the P4 502 source. The N5 602 gate is connected to the output of the third inverter 428, and the N5 602 source is connected to the low voltage reference terminal 414. Additionally, FIG. 6 illustrates two parasitic capacitances, shown as a first parasitic capacitance Cpar1 604 and a second parasitic capacitance Cpar2 606. The Cpar 1 604 is connected from the P3 434 drain and the P4 502 source to the low voltage reference terminal 414. The Cpar2 606 is connected from the third node 420, and thus to the P4 502 drain and the N3 436 drain, to the low voltage reference terminal 414.

The operation of the timing circuitry 600 includes the addition of the N5 602, which further reduces the possibility of a potential glitch to a wrongful timed operation of the comparator 202. Specifically, once the P4 502 turns on, there is a conductive path from the Cpar1 604 to the Cpar 2 606. This conductive path could permit charge sharing from the Cpar1 604 to the Cpar 2 606, and thereby prematurely provide a non-zero glitch voltage to the third node 420, which might false assert CMP_EN. However, the opposite conductivity type of the P3 434 and the N5 602, each with a gate mutually connected to the output of the third inverter 428, causes the N5 602 to turn on when the P3 434 is turned off During this time, the enabled N5 602 connects the Cpar1 604 to the low voltage reference terminal 414 (e.g., ground), thereby discharging Cpar1 604. The discharge prevents charge from being passed through the P4 502 when it is enabled and shared to the Cpar2 606. This reduces the possibility of an output glitch (and comparator response) that could otherwise occur with such charge sharing.

Figure 7:
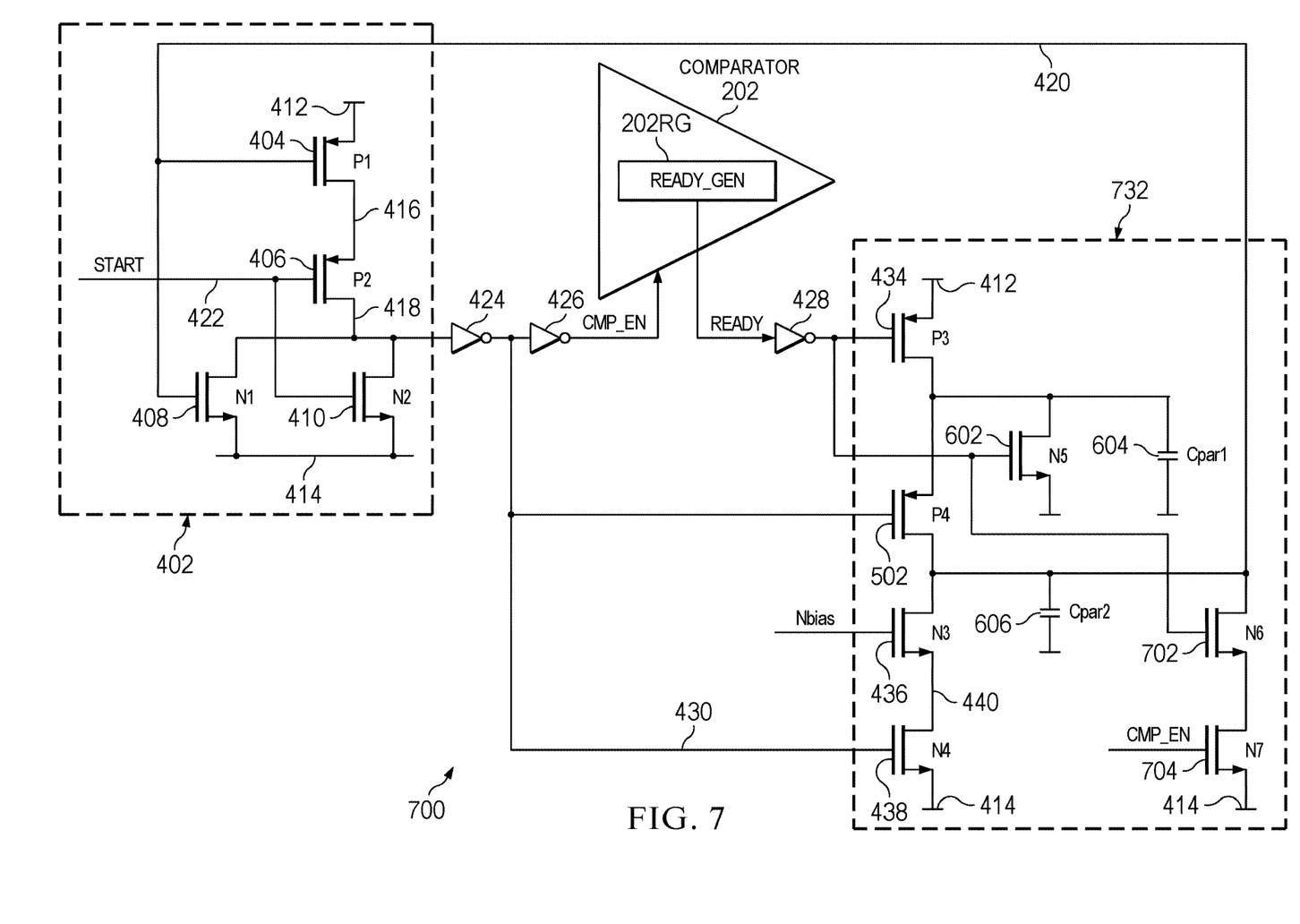
FIG. 7 is an electrical diagram of a fourth example of a timing circuitry 700 as may be implemented in the FIG. 2 asynchronous timer 208.

FIG. 7 is an electrical diagram of a fourth example of a timing circuitry 700 as may be implemented in the FIG. 2 asynchronous timer 208, so as to achieve the FIG. 3 timing diagram 300. The timing circuitry 700 includes the same elements as the FIG. 6 timing circuitry 600, with additional components and connectivity added with respect to a second transistor stage 732. Specifically, the timing circuitry 700 includes a sixth NMOS transistor N6 702 and a seventh NMOS transistor N7 704. The N6 702 drain is connected to the third node 420. The N6 702 gate is connected to the output of the third inverter 428 and to the gates of the P3 434 and the N5 602. The N6 702 source is connected to the N7 704 drain. The N7 704 gate is connected to receive CMP_EN, and the N7 704 source is connected to the low voltage reference terminal 414.

The operation of the timing circuitry 700 includes the addition of the N6 702 and the N7 704, which further reduces the possibility of potential negative effects from a floating potential on the third node 420. Specifically, as described earlier, when the first inverter 424 output is high, the N4 438 is enabled which causes the third node 420 to be low. Conversely, when the first inverter 424 output is low, the N4 438 turns off, and after a one-inverter delay, CMP_EN rises at t0 or t4 (FIG. 3). Meanwhile, READY is low, so the output of the third inverter 428 is high. Accordingly, without the N6 702 and the N7 704, the third node 420 may float.

However, with the FIG. 7 example, the low READY is inverted by the third inverter 428 and output as high, which enables the N6 702. At the same time, the rising or high CMP_EN enables the N7 704. With both the N6 702 and the N7 704 enabled, the third node 420 is connected fully to the low voltage reference terminal 414. This fully low condition at the third node 420 remains until READY transitions high. When READY transitions high, the high is inverted over a one-inverter delay by the third inverter 428, and responsively the third inverter 428 output goes low. The low from the third inverter 428 output disables the N6 702 and then permits the additional signal transitions described earlier. Particularly, the low from the third inverter 428 output enables the P3 434, while the P4 502 is also enabled by the low from the output of the first inverter 424. Accordingly, once the P3 434 and the P4 502 turn on, the third node 420 goes high. This transition to high at the third node 420 is provided to the first transistor stage 402 and initiates the operations described above. Particularly, the high at the third node 420 is provided to the input of the inverter 424, which outputs a high to the input of the inverter 426, which causes the inverter 426 to output CMP_EN to transition low, and so forth.

Figure 8:
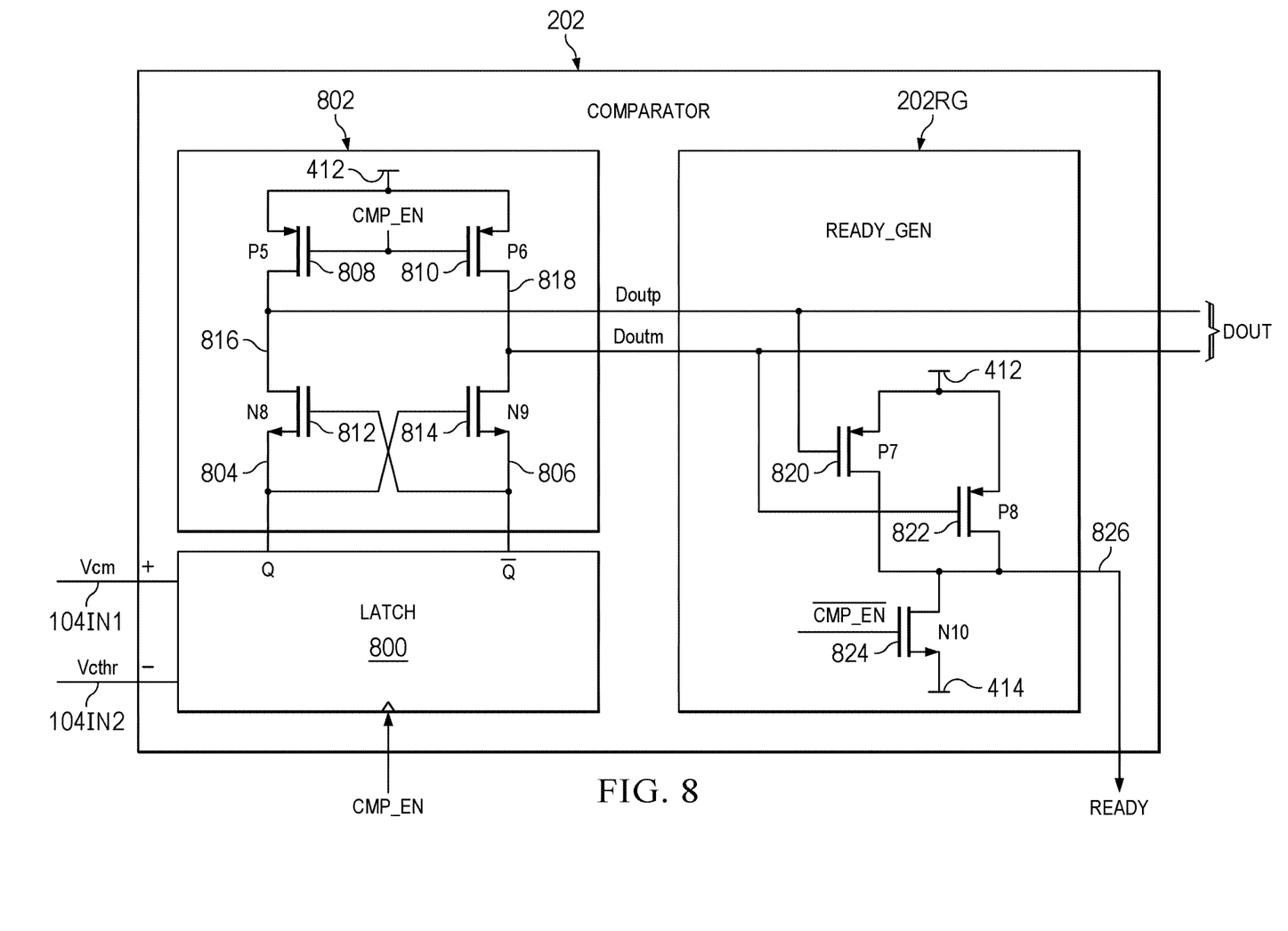
FIG. 8 is an electrical diagram of an example of the FIG. 2 comparator 202.

FIG. 8 is an electrical diagram of an example of the FIG. 2 comparator 202. The comparator 202 includes a latch 800, a cross-coupled circuit 802, and the READY signal generator 202RG. In an example, the cross-coupled circuit 802 is an analog exclusive OR (XOR) circuit.

The latch 800 is connected to (or has) the first and second inputs, 104IN1 and 104IN2. The latch 800 may be implemented as a dynamic comparator, where the CMP_EN signal is input as the clock (or enabling) input to the dynamic comparator. Further, in an example, the latch 800 (or dynamic comparator) latches based on its inputs once enabled by the rising CMP_EN edge. The latch 800 maintains its output based on that condition, until again reset by a subsequent falling CMP_EN edge, irrespective of whether one or both of the input signals changes during that latched condition. The latch 800 has complementary digital outputs, Q and Q̄, coupled to respective first and second output nodes 804 and 806. The output nodes 804 and 806 are coupled to the cross-coupled circuit 802. In addition, the signals at latch outputs Q, Q̄ are the same in the reset phase.

The cross-coupled circuit 802 includes a fifth PMOS transistor P5 808, a sixth PMOS transistor P6 810, an eighth NMOS transistor N8 812, and a ninth NMOS transistor N9 814. The high voltage reference terminal 412 is connected to the P5 808 source and the P6 810 source. The signal CMP_EN is provided to the P5 808 gate and the P6 810 gate. The P5 808 drain is connected to a seventh node 816, which provides a differential signal Doutp. The P6 810 drain is connected to an eight node 818, which provides a differential signal Doutm. The relative and complementary values of Doutp and Doutm provide Dout. The seventh node 816 is also connected to the N8 812 drain, and the eight node 818 is also connected to the N9 814 drain. The gates of the N8 812 and the N9 814 are cross-coupled. Namely, the N8 812 gate is connected to the N9 814 source, and the N9 814 gate is connected to the N8 812 source. The N8 812 source is also connected to the first output node 804, and the N9 814 source is also connected to the second output node 806.

The READY signal generator 202RG receives Doutp and Doutm, from respective nodes 816 and 818. Particularly, the READY signal generator 202RG includes a seventh PMOS transistor P7 820, an eighth PMOS transistor P8 822, and a tenth NMOS transistor N10 824. The high voltage reference terminal 412 is connected to the P7 810 source and the P8 822 source. The P7 820 gate is connected to the seventh node 816 and receives Doutp, and the P8 822 gate is connected to the eight node 818 and receives Doutm. The P7 820 drain and the P8 822 drain are connected to a ninth node 826, which provides the READY signal. The ninth node 826 is also connected to the N10 824 drain. The N10 824 gate receives $\overline{CMP\_EN}$, and the N10 824 source is connected to the low voltage reference terminal 414.

The operation of the FIG. 8 comparator 202 is now detailed, given the earlier introduction that the comparator 202 produces Dout in response to a comparison of Vcm and Vcthr. A rising edge of CMP_EN enables the latch 800. In response, the latch 800 compares Vcm and Vthr, to produce complementary outputs Q and $\overline{Q}$, at the respective first and second output nodes 804 and 806. The latch output signals, and the corresponding respective states at the first and second output nodes 804 and 806, depends on which of Vcm and Vthr is greater than the other. Particularly, when CMP_EN rises, both the P5 808 and P6 810 are enabled and respectively connect the nodes 816 and 818 to the high voltage reference terminal 412. Once CMP_EN rises, P5 808 and P6 810 are disabled and one of the two complementary outputs Q and $\overline{Q}$ will be low and the other high. The high value provided to the cross-coupled gate of the N9 814 or the N8 812 enables the respective transistor. The enabled N9 814 or N8 812 has a low connected to its source. The source, thus, pulls down the node 816 or 818 that is connected thereto. The other nodes 816 and 818 remain high, thereby creating complementary signals in Doutp and Doutm. However, when CMP_EN is low, those signals are not considered valid.

The complementary signals in Doutp and Doutm also trigger the READY signal generator 202RG. Particularly, the low level of Doutp or Doutm enables the respective one of either the P7 820 or P8 822, to which the low is gate-connected. Accordingly, after the delay of enabling one of those transistors, the enabled transistor connects the high voltage reference terminal 412 to the ninth node 826, thereby asserting READY (e.g., FIG. 3, t1). Thereafter, when CMP_EN transitions low, its complement transitions high. That high signal enables the N10 824, thereby de-asserting READY (e.g., FIG. 3, t3).

The FIG. 8 example of the comparator 202 may have one or more benefits. For example, each of the seventh and eighth nodes 816 and 818, providing the Doutp and Doutm signals, is symmetrically loaded by a corresponding PMOS gate (of P7 820 and P8 822). This avoids potential negative operation from asymmetric loading. As another example, the overall time in triggering and responding with a level change in READY may be reduced, as compared to other approaches.

Figure 9:
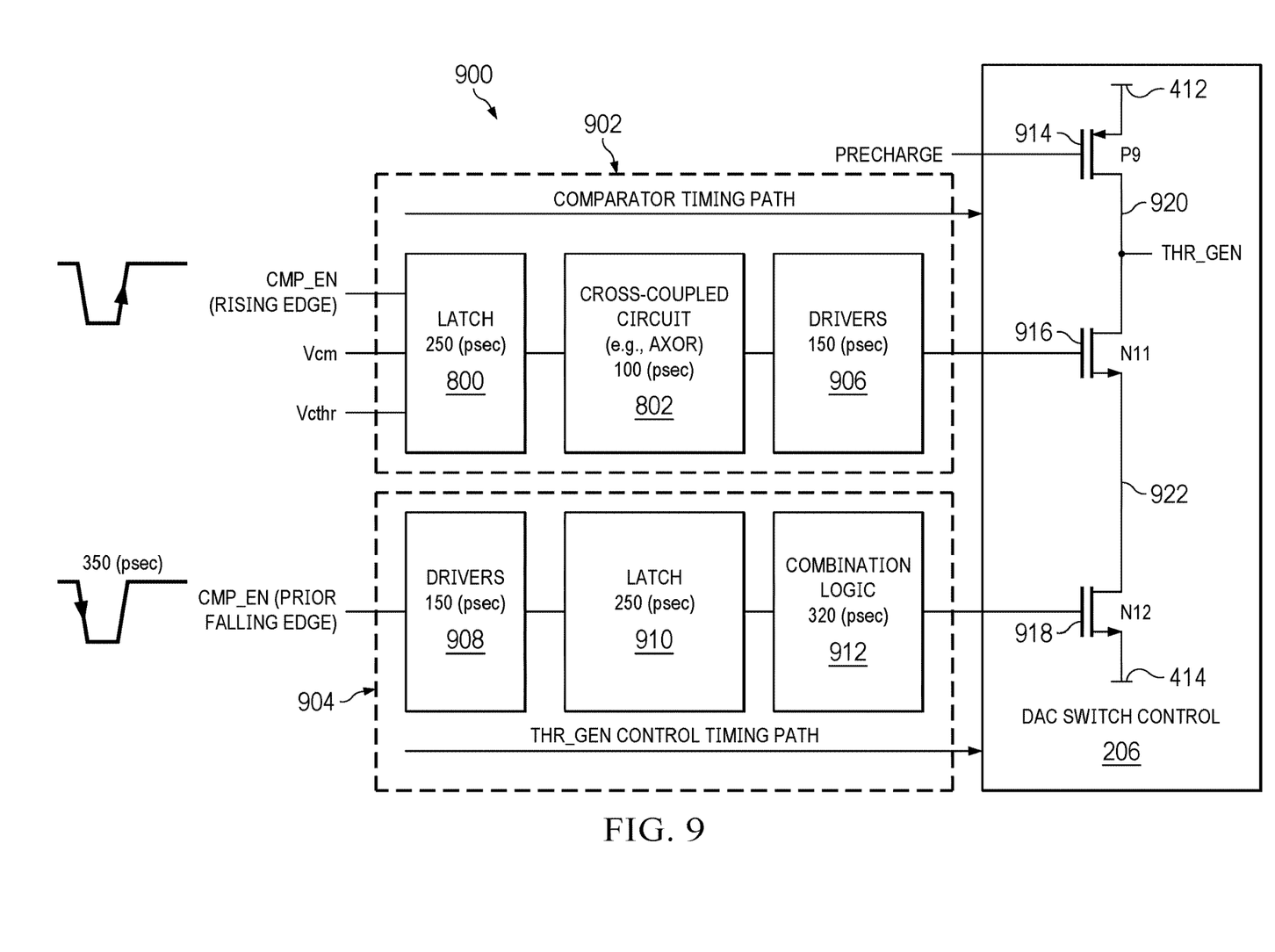
FIG. 9 is an electrical diagram of an example signal path architecture 900.

FIG. 9 is an electrical diagram of an example signal path architecture 900 that includes a portion of the FIG. 2 DAC switch control 206, a first signal path 902, and a second signal path 904. The first and second signal paths 902, 904, provide drive signals to N11 916 and N12 918 of the DAC switch control 206 to cause and time the assertion of THR_GEN, which influences the switching circuitry of the C-DAC 204. More specifically, recall in FIG. 2 that the asynchronous timer 208 asserts CMP_EN to enable the comparator 202, which responsively compares its input values as provided by the C-DAC 204. In this context, the signal path architecture 900 may enhance the timing for asserting THR_GEN, so that Vcthr is generated in an efficient time to be available for comparison by the enabled comparator 202.

The first signal path 902 is connected in a time sequencing timing path associated with the comparator 202. The first signal path 902 includes the FIG. 8 latch 800, cross-coupled circuit 802, and a first set of drivers 906. The latch 800 output is connected to an input of the cross-coupled circuit 802. An output of the cross-coupled circuit 802 is coupled to an input of the first set of drivers 906. The first set of drivers 906 may be included based on loading from the output of the cross-coupled circuit 802 and may be implemented with a combination of inverters. Further, the first signal path 902 is triggered, at least in part, by a rising edge of CMP_EN. Specifically, the FIG. 8 latch 800 includes, as described earlier, three inputs, one of which receives CMP_EN, as also shown in FIG. 9. A rising edge of CMP_EN triggers the latch 800 to provide Q and $\overline{Q}$. Q and $\overline{Q}$ trigger the cross-coupled circuit 802 to provide Doutp and Doutm. Doutp and Doutm trigger the first set of drivers 906. The first set of drivers 906 may include one or more transistors/inverters to provide a first transistor gate driving signal to the DAC switch control 206.

The second signal path 904 includes circuit blocks connected in a time sequencing path to control the assertion, including the timing of that assertion, of THR_GEN to the C-DAC 204. The second signal path 904 includes a second set of drivers 908, a latch 910, and a combination logic block 912. The drivers 908 support a sufficient driving signal in view of loading that may be imposed by the latch 910. For example, the drivers 908 are implemented with a combination of inverters, and the latch 910 is implemented by a flip-flop, such as a J-K flip flop. In an example, the combination logic block 912 includes logic gates and converters with sufficient logic to enable the N12 918 when appropriate. In contrast to the first signal path 902, the second signal path 904 is triggered, at least in part, by the immediately-preceding falling edge of CMP_EN, as compared to the next rising edge of CMP_EN that triggers the first signal path 902. Accordingly, the second signal (and control) path 904 is triggered earlier than the first signal path 902, for example 350 psec earlier, corresponding to the time between the falling and rising edges of CMP_EN.

The FIG. 9 DAC switch control 206 incudes a ninth PMOS transistor P9 914 and eleventh and twelfth NMOS transistors N11 916 and N12 918. For reasons further described below, in an example, the N12 918 is physically larger than the N11 916, for example by a factor of four or five. As shown, the P9 914, N11 916, and N12 918 are connected in series between the high voltage reference terminal 412 and the low voltage reference terminal 414. Namely, the P9 914 source is connected to the high voltage reference terminal 412, and the P9 914 gate receives an active low precharge signal. In this example, the P9 914 is connected to an output of the SAR controller 116 to receive the precharge signal. The P9 914 drain is connected to a tenth node 920 to receive THR_GEN. The tenth node 920 is also connected to the N11 916 drain. The N11 916 gate is connected to the output of the first signal path 902 to receive the first transistor gate driving signal. The N11 916 source is connected to an eleventh node 922, and the eleventh node 922 is also connected to the N12 918 drain. The N12 918 gate is connected to the output of the second signal path 904 to receive the second transistor gate driving signal. The N12 918 source is connected to the low voltage reference terminal 414.

The operation of the signal path architecture 900, for a single operational sequence of the C-DAC 204, first precharges the tenth node 920. The precharge is achieved by enabling the P9 914 for a precharge period, and then disabling the P9 914. Thereafter, the N12 918 turns on. However, while the N12 918 is on, the tenth node 920 may be discharged only if the N11 916 is also enabled depending on the decision of the latch 800. The timing of the potential THR_GEN discharge is based on the respective timing of the first and second signal paths 902 and 904, in combination with the different edges of CMP_EN (rising versus immediately-preceding falling) applied respectively to each path.

When each of the signal paths 902 and 904 is initially triggered, a signal propagates through the delay imposed by each block along the respective path. Ultimately, a transistor gate driving signal is asserted at the end of each of the signal paths 902 and 904, thereby enabling a respective one of the N11 916 and the N12 918. For example, FIG. 9 shows, in parentheses, an approximate delay through each of the blocks in the first and second paths 902 and 904. In the example, the first signal path 902 aggregates a total delay of 500 psec (250+100+150=500), and the second signal path 904 aggregates a total delay of 720 psec (150+250+320=720). Accordingly, in a nominal comparison, the first signal path 902 is 220 psec faster to enable the N11 916 than the slower second signal path 904 is to enable the N12 918.

While the first signal path 902 is nominally faster by having a smaller delay as compared to the second signal path 904, the second signal path 904 is triggered before the first signal path 902, for example 350 psec before. Accordingly, in a given operational sequence, the N12 918 receives an enabling signal from the second signal path 904, before the N11 916 receives an enabling signal from the first signal path 902. For example, the second signal path 904 may produce its enabling signal approximately 130 psec earlier than the first signal path 902.

In an example, the N12 918 is sized differently than the N11 916. For instance, the N12 918 is larger than the N11 916. Accordingly, when the N12 918 receives an enabling signal, it will take a longer respective period to turn on (due to capacitance) as compared to the time to turn on N11 916 when it receives an enabling signal. However, because of the different timed triggering signals to the paths 902 and 904 as detailed above, the N12 918 is predictably first to enable in a given sequence. Thus, even though it takes the N12 918 longer than the N11 916 to turn on, that time can be offset by the combination of the delay between the prior falling edge of CMP_EN and the next rising edge of CMP_EN, and the total aggregate delay of each path. Accordingly, once the smaller N11 916 receives an enabling signal from the first path 902, it can turn on relatively faster than does the N12 918. So, the earlier longer turn on period of the N12 918 provides an advantage of facilitating a faster subsequent turn on period of the N11 916, thereby reducing the total enabling time of the signal path architecture 900 and correspondingly the THR_GEN transition. Further, the earlier THR_GEN transition likewise facilitates an earlier operation of the C-DAC 204, per ADC sequence, and it reduces loading on the comparator.

From the above, described examples provide an asynchronous ADC, for example in an IC SAR loop. The ADC may implement various improvements, for example by reducing one or more delay causes in or regarding the ADC. Example improvements include, in the asynchronous timing, expedited generation of a signal representing a comparator ready, and controlling a C-DAC (or like structure) with less delay in providing a value for a successive ADC comparison. Numerous alternatives and benefits have been described and/or illustrated. Other benefits include variations and modifications to the structure, in addition to the examples that have been provided.

While the use of particular transistors is described herein, other transistors (or equivalent devices) may be used instead with little or no change to the remaining circuitry. For example, a metal-oxide-silicon FET ("MOSFET") (such as an n-channel MOSFET, nMOSFET, or a p-channel MOSFET, pMOSFET), a bipolar junction transistor (BJT—e.g., NPN or PNP), insulated gate bipolar transistors (IGBTs), and/or junction field effect transistor (JFET) may be used in place of or in conjunction with the devices disclosed herein. The transistors may be depletion mode devices, drain-extended devices, enhancement mode devices, natural transistors or other type of device structure transistors. Further, the devices may be implemented in/over a silicon substrate (Si), a silicon carbide substrate (SiC), a gallium nitride substrate (GaN) or a gallium arsenide substrate (GaAs).

Further, various connections have been described, while relatedly the terms "coupled to" or "couples with" (and the like) as used herein without further qualification are intended to describe either an indirect or direct electrical connection. Thus, if a first device "couples" to a second device, that connection can be through a direct electrical connection where there may be only parasitics in the pathway, or through an indirect electrical connection via intervening items including other devices and connections. For indirect coupling, the intervening item generally does not modify the information of a signal but may adjust its current level, voltage level, and/or power level. Accordingly, additional modifications are possible in the described examples, and other examples are possible, within the scope of the following claims.

What is claimed is:

1. An integrated circuit, comprising:
   a comparator having a data input, a threshold input, an enable signal input, a data output, and a ready signal output; and
   timing circuitry coupled to the enable signal input and the ready signal output and including:
   a first transistor having a first terminal coupled to a first reference voltage terminal and having a control terminal;
   a second transistor having a first terminal coupled to a second reference voltage terminal and having a control terminal;
   a first inverter having an input coupled to the control terminal of the second transistor and having an output coupled to the enable signal input; and
   a second inverter having an input coupled to the ready signal output of the comparator and having an output coupled to the control terminal of the first transistor.

2. The integrated circuit of claim 1, further comprising:
a third inverter of the timing circuitry, the third inverter having an input and an output, the output of the third inverter coupled to the input of the first inverter; and
a transistor stage coupled to the timing circuitry, to the input of the third inverter, and to the first and second reference voltage terminals.

3. The integrated circuit of claim 2, wherein the transistor stage includes:
a third transistor having a control terminal and first and second terminals, the control terminal of the third transistor coupled to the timing circuitry, the first terminal of the third transistor coupled to the first reference voltage terminal;
a fourth transistor having first and second terminals, the first terminal of the fourth transistor coupled to the second terminal of the third transistor, the second terminal of the fourth transistor coupled to the input of the third inverter;
a fifth transistor having a control terminal and first and second terminals, the control terminal of the fifth transistor coupled to the timing circuitry, the first terminal of the fifth transistor coupled to the input of the third inverter, the second terminal of the fifth transistor coupled to the second reference voltage terminal; and
a sixth transistor having first and second terminals, the first terminal of the sixth transistor coupled to the control terminal of the input of the third inverter, the second terminal of the sixth transistor coupled to the second reference voltage terminal.

4. The integrated circuit of claim 2, wherein the timing circuitry further includes a third transistor having first and second terminals, the first terminal of the third transistor coupled to a second terminal of the first transistor and to the transistor stage, the second terminal of the third transistor coupled to a second terminal of the second transistor.

5. The integrated circuit of claim 2, wherein the timing circuitry further includes:
a third transistor having a control terminal and first and second terminals, the control terminal of the third transistor coupled to the output of the third inverter, and the first terminal of the third transistor coupled to a second terminal of the first transistor; and
a fourth transistor having first and second terminals, the first terminal of the fourth transistor coupled to the second terminal of the third transistor, and the second terminal of the fourth transistor coupled to a second terminal of the second transistor.

6. The integrated circuit of claim 2, wherein the timing circuitry further includes:
a third transistor having a control terminal and first and second terminals, the control terminal of the third transistor coupled to the output of the third inverter, and the first terminal of the third transistor coupled to a second terminal of the first transistor;
a fourth transistor having first and second terminals, the first terminal of the fourth transistor coupled to the second terminal of the third transistor, and the second terminal of the fourth transistor coupled to a second terminal of the second transistor; and
a fifth transistor having a control terminal and first and second terminals, the control terminal of the fifth transistor coupled to the output of the second inverter, the first terminal of the fifth transistor coupled to a second terminal of the first transistor, and the second terminal of the fifth transistor coupled to the second reference voltage terminal.

7. The integrated circuit of claim 2, wherein the timing circuitry further includes:
a third transistor having a control terminal and first and second terminals, the control terminal of the third transistor coupled to the output of the third inverter, and the first terminal of the third transistor coupled to a second terminal of the first transistor;
a fourth transistor having first and second terminals, the first terminal of the fourth transistor coupled to the second terminal of the third transistor, and the second terminal of the fourth transistor coupled to a second terminal of the second transistor; and
a fifth transistor having a control terminal and first and second terminals, the control terminal of the fifth transistor coupled to the output of the second inverter, the first terminal of the fifth transistorcoupled to a second terminal of the first transistor, and the second terminal of the fifth transistor coupled to the second reference voltage terminal;
a sixth transistor having a control terminal and first and second terminals, the control terminal of the sixth transistor coupled to the control terminal of the fifth transistor and to the output of the second inverter, the first terminal of the sixth transistor coupled to the second terminal of the third transistor and to the first terminal of the fourth transistor; and
a seventh transistor having first and second terminals, the first terminal of the seventh transistor coupled to the second terminal of the sixth transistor, and the second terminal of the seventh transistor coupled to the second reference voltage terminal.

8. The integrated circuit of claim 1, wherein the comparator includes:
a latch having a first output and a second output;
a cross-coupled circuit including a first and second differential input and a first and second differential output, the first differential input coupled to the first output of the latch and the second differential input coupled to the second output of the latch; and
a signal generator circuit including a third transistor having a control terminal and a fourth transistor having a control terminal, the control terminal of the third transistor coupled to the first differential output and the control terminal of the fourth transistor coupled to the second differential output.

9. The integrated circuit of claim 8 wherein the third transistor has a first terminal and a second terminal and the fourth transistor has a first terminal and a second terminal, the first terminal of the third transistor coupled to the first terminal of the fourth transistor and the second terminal of the of the third transistor coupled to the second terminal of the fourth transistor.

10. The integrated circuit of claim 9 wherein the second terminal of the of the third transistor and the second terminal of the fourth transistor are coupled to the output of the comparator.

11. The integrated circuit of claim 8, further comprising a digital-to-analog converter having a first output coupled to the first data input and a second output coupled to the threshold input.

12. The integrated circuit of claim 11 wherein the digital-to-analog converter further has a threshold generation input, and further including a switch control circuit having an output coupled to the threshold generation input.

13. The integrated circuit of claim 12 wherein the switch control circuit includes a fifth transistor having a control terminal and a sixth transistor having a control terminal, the control terminal of the fifth transistor adapted to be enabled in response to a rising edge of an enable signal adapted to be provided to the enable signal input and the control terminal of the sixth transistor adapted to be enabled in response to a falling edge of the enable signal.

14. The integrated circuit of claim 13 wherein the sixth transistor is larger than the fifth transistor.

15. An integrated circuit, comprising:
a comparator having a signal input, an enable signal input, and a ready condition output;
a digital-to-analog converter having a threshold voltage generation input and at least one output coupled to the signal input; and
timing circuitry coupled to the enable signal input, the timing circuitry operable to successively assert an enable signal to the enable signal input irrespective of a timing of a ready signal from the ready condition output.

16. The integrated circuit of claim 15 wherein the timing circuitry includes a first terminal for providing the enable signal and a transistor stage, the transistor stage coupled to the first terminal and operable to initiate a successive assertion of the enable signal in response to a prior assertion of the enable signal as represented at the first terminal.

17. An analog-to-digital converter on an integrated circuit, comprising:
a sample and hold circuit having an input and an output;
a threshold and compare circuit having an input coupled to the output of the sample and hold circuit, and including
a comparator having a data input, a threshold input, an enable signal input, a data output, and a ready signal output; and
timing circuitry coupled to the enable signal input and the ready signal output and including:
a first transistor having a first terminal coupled to a first reference voltage terminal and having a control terminal;
a second transistor having a first terminal coupled to a second reference voltage terminal and having a control terminal;
a first inverter having an input coupled to the control terminal of the second transistor and having an output coupled to the enable signal input; and
a second inverter having an input coupled to the ready signal output of the comparator and having an output coupled to the control terminal of the first transistor.

18. The analog-to-digital converter of claim 17, wherein the timing circuitry further including:

a third inverter of the timing circuitry, the third inverter having an input and an output, the output of the third inverter coupled to the input of the first inverter; and
a transistor stage coupled to the timing circuitry, to the input of the third inverter, and to the first and second reference voltage terminals.

19. The analog-to-digital converter of claim 18, the timing circuitry further including:
a third transistor having a control terminal and first and second terminals, the control terminal of the third transistor coupled to the output of the third inverter, and the first terminal of the third transistor coupled to a second terminal of the first transistor; and
a fourth transistor having first and second terminals, the first terminal of the fourth transistor coupled to the second terminal of the third transistor, and the second terminal of the fourth transistor coupled to a second terminal of the second transistor.

20. The analog-to-digital converter of claim 18, the timing circuitry further including:
a third transistor having a control terminal and first and second terminals, the control terminal of the third transistor coupled to the output of the third inverter, and the first terminal of the third transistor coupled to a second terminal of the first transistor;
a fourth transistor having first and second terminals, the first terminal of the fourth transistor coupled to the second terminal of the third transistor, and the second terminal of the fourth transistor coupled to a second terminal of the second transistor; and
a fifth transistor having a control terminal and first and second terminals, the control terminal of the fifth transistor coupled to the output of the second inverter, the first terminal of the fifth transistor coupled to a second terminal of the first transistor, and the second terminal of the fifth transistor coupled to the second reference voltage terminal;
a sixth transistor having a control terminal and first and second terminals, the control terminal of the sixth transistor coupled to the control terminal of the fifth transistor and to the output of the second inverter, the first terminal of the sixth transistor coupled to the second terminal of the third transistor and to the first terminal of the fourth transistor; and
a seventh transistor having first and second terminals, the first terminal of the seventh transistor coupled to the second terminal of the sixth transistor, and the second terminal of the seventh transistor coupled to the second reference voltage terminal.

\* \* \* \* \*